(12) United States Patent
Hnayno et al.

(10) Patent No.: US 11,924,998 B2
(45) Date of Patent: Mar. 5, 2024

(54) HYBRID IMMERSION COOLING SYSTEM FOR RACK-MOUNTED ELECTRONIC ASSEMBLIES

(71) Applicant: OVH, Roubaix (FR)

(72) Inventors: Mohamad Hnayno, Roubaix (FR); Ali Chehade, Moncheaux (FR); Henryk Klaba, Villeneuve d'Ascq (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/701,422

(22) Filed: Mar. 22, 2022

(65) Prior Publication Data
US 2022/0322575 A1    Oct. 6, 2022

(30) Foreign Application Priority Data

Apr. 1, 2021 (EP) .................................. 21305427
Aug. 30, 2021 (EP) .................................. 21306171

(51) Int. Cl.
*H05K 7/20* (2006.01)

(52) U.S. Cl.
CPC ..... *H05K 7/20263* (2013.01); *H05K 7/20236* (2013.01); *H05K 7/20772* (2013.01)

(58) Field of Classification Search
CPC ............... H05K 7/20236; H05K 7/203; H05K 7/20445; H05K 7/20772; H05K 7/20872–20881; H05K 7/20927–20936; H01L 23/34; H01L 23/44; H01L 23/427; H01L 23/46; H01L 23/473; H03L 1/04
See application file for complete search history.

(56) References Cited

U.S. PATENT DOCUMENTS

| 2,115,501 A | 4/1938 | Sergius |
| 2,316,296 A | 4/1943 | Simonds |

(Continued)

FOREIGN PATENT DOCUMENTS

| CN | 211184672 U | 8/2020 |
| CN | 110430725 B | 2/2021 |

(Continued)

OTHER PUBLICATIONS

Extended European Search Report with regard to the counterpart EP Patent Application No. 22305018.8 completed Jun. 24, 2022.

(Continued)

*Primary Examiner* — Amir A Jalali
(74) *Attorney, Agent, or Firm* — BCF LLP

(57) ABSTRACT

The disclosed systems and structures are directed to providing a hybrid liquid-cooling system for at least one rack-mounted immersion case containing at least one electronic assembly submerged in dielectric immersion cooling liquid. The hybrid liquid cooling system comprises a closed-loop fluid distribution arrangement configured to circulate channelized fluid, an external cooling module configured to thermally condition the channelized fluid circulated by the closed-loop fluid distribution arrangement, a serpentine convection coil structured to internally convey channelized fluid to operatively cool ambient temperatures of the dielectric immersion cooling liquid, and one or more fluid cooling blocks arranged to be in direct thermal contact with one or more heat-generating electronic processing components of the at least one electronic assembly.

15 Claims, 6 Drawing Sheets

(56) References Cited

U.S. PATENT DOCUMENTS

| | | | |
|---|---|---|---|
| 3,938,689 A | 2/1976 | De Munnik | |
| 4,619,316 A * | 10/1986 | Nakayama | F28F 13/187 |
| | | | 257/713 |
| 4,888,664 A | 12/1989 | Rojc | |
| 5,268,814 A | 12/1993 | Yakubowski | |
| 5,307,956 A | 5/1994 | Richter et al. | |
| 5,669,524 A | 9/1997 | Loedel | |
| 5,907,473 A | 5/1999 | Przilas et al. | |
| 6,023,934 A * | 2/2000 | Gold | H01L 23/445 |
| | | | 62/51.1 |
| 6,746,388 B2 | 6/2004 | Edwards et al. | |
| 7,369,410 B2 | 5/2008 | Chen et al. | |
| 7,403,392 B2 | 7/2008 | Attlesey et al. | |
| 7,414,845 B2 | 8/2008 | Attlesey et al. | |
| 7,527,085 B2 | 5/2009 | Ijima et al. | |
| 7,724,517 B2 | 5/2010 | Attlesey et al. | |
| 7,885,070 B2 | 2/2011 | Campbell et al. | |
| 7,905,106 B2 | 3/2011 | Attlesey | |
| 7,911,782 B2 | 3/2011 | Attlesey et al. | |
| 7,911,793 B2 | 3/2011 | Attlesey | |
| 8,009,419 B2 | 8/2011 | Attlesey et al. | |
| 8,014,150 B2 | 9/2011 | Campbell et al. | |
| 8,089,764 B2 | 1/2012 | Attlesey | |
| 8,089,765 B2 | 1/2012 | Attlesey | |
| 8,089,766 B2 | 1/2012 | Attlesey | |
| 8,305,759 B2 | 11/2012 | Attlesey et al. | |
| 8,467,189 B2 | 6/2013 | Attlesey | |
| 8,619,425 B2 | 12/2013 | Campbell et al. | |
| 8,654,529 B2 | 2/2014 | Tufty et al. | |
| 8,934,244 B2 | 1/2015 | Shelnutt et al. | |
| 8,953,317 B2 | 2/2015 | Campbell et al. | |
| 9,049,800 B2 | 6/2015 | Shelnutt et al. | |
| 9,051,502 B2 | 6/2015 | Sedarous et al. | |
| 9,086,859 B2 | 7/2015 | Tufty et al. | |
| 9,128,681 B2 | 9/2015 | Tufty et al. | |
| 9,144,179 B2 | 9/2015 | Shelnutt et al. | |
| 9,155,230 B2 | 10/2015 | Eriksen | |
| 9,176,547 B2 | 11/2015 | Tufty et al. | |
| 9,195,282 B2 | 11/2015 | Shelnutt et al. | |
| 9,223,360 B2 | 12/2015 | Tufty et al. | |
| 9,328,964 B2 | 5/2016 | Shelnutt et al. | |
| 9,335,802 B2 | 5/2016 | Shelnutt et al. | |
| 9,351,429 B2 | 5/2016 | Shelnutt et al. | |
| 9,426,927 B2 | 8/2016 | Shafer et al. | |
| 9,436,235 B2 | 9/2016 | Damaraju et al. | |
| 9,464,854 B2 | 10/2016 | Shelnutt et al. | |
| 9,529,395 B2 | 12/2016 | Franz et al. | |
| 9,699,938 B2 | 7/2017 | Shelnutt et al. | |
| 9,699,939 B2 | 7/2017 | Smith | |
| 9,717,166 B2 | 7/2017 | Eriksen | |
| 9,756,766 B2 | 9/2017 | Best | |
| 9,773,526 B2 | 9/2017 | Shelnutt et al. | |
| 9,781,859 B1 | 10/2017 | Wishman et al. | |
| 9,795,065 B2 | 10/2017 | Shelnutt et al. | |
| 9,839,164 B2 | 12/2017 | Shelnutt et al. | |
| 9,844,166 B2 | 12/2017 | Shelnutt et al. | |
| 9,921,622 B2 | 3/2018 | Shelnutt et al. | |
| 9,968,010 B2 | 5/2018 | Shelnutt et al. | |
| 9,992,914 B2 | 6/2018 | Best et al. | |
| 10,010,013 B2 | 6/2018 | Shelnutt et al. | |
| 10,018,425 B2 | 7/2018 | Shelnutt et al. | |
| 10,020,242 B2 | 7/2018 | Katsumata et al. | |
| 10,064,314 B2 | 8/2018 | Shelnutt et al. | |
| 10,130,008 B2 | 11/2018 | Shepard et al. | |
| 10,143,113 B2 | 11/2018 | Shelnutt et al. | |
| 10,143,114 B2 | 11/2018 | Shelnutt et al. | |
| 10,146,231 B2 | 12/2018 | Shelnutt et al. | |
| 10,149,408 B2 | 12/2018 | Fujiwara et al. | |
| 10,156,873 B2 | 12/2018 | Shelnutt et al. | |
| 10,172,262 B2 | 1/2019 | Shelnutt et al. | |
| 10,206,312 B2 | 2/2019 | Shelnutt et al. | |
| 10,212,857 B2 | 2/2019 | Eriksen | |
| 10,225,958 B1 | 3/2019 | Gao | |
| 10,238,010 B2 | 3/2019 | Shelnutt et al. | |
| 10,271,456 B2 | 4/2019 | Tufty et al. | |
| 10,321,609 B2 | 6/2019 | Hirai et al. | |
| 10,331,144 B2 | 6/2019 | Shelnutt et al. | |
| 10,399,190 B2 | 9/2019 | North et al. | |
| 10,542,635 B2 | 1/2020 | Nishiyama | |
| 10,617,042 B2 | 4/2020 | Shelnutt et al. | |
| 10,622,283 B2 | 4/2020 | Leobandung | |
| 10,624,236 B2 | 4/2020 | Inano et al. | |
| 10,624,242 B2 | 4/2020 | Best | |
| 10,638,641 B2 | 4/2020 | Franz et al. | |
| 10,645,841 B1 | 5/2020 | Mao et al. | |
| 10,653,036 B1 | 5/2020 | Gao | |
| 10,667,434 B1 | 5/2020 | Mao et al. | |
| 10,674,641 B2 | 6/2020 | Shepard et al. | |
| 10,729,039 B2 | 7/2020 | Shelnutt et al. | |
| 10,791,647 B1 | 9/2020 | Miyamura et al. | |
| 10,871,807 B2 | 12/2020 | Best et al. | |
| 10,888,032 B2 * | 1/2021 | Wakino | H01L 23/427 |
| 10,917,998 B2 | 2/2021 | Shelnutt et al. | |
| 10,932,390 B2 | 2/2021 | Korikawa | |
| 10,939,580 B2 | 3/2021 | Gao | |
| 10,939,581 B1 | 3/2021 | Chen et al. | |
| 10,990,144 B2 | 4/2021 | Wang et al. | |
| 11,006,547 B2 | 5/2021 | Gao | |
| 11,032,939 B2 | 6/2021 | Tufty et al. | |
| 11,071,238 B2 | 7/2021 | Edmunds et al. | |
| 11,268,739 B2 | 3/2022 | Wang et al. | |
| 11,751,359 B2 | 9/2023 | Heydari | |
| 11,822,398 B2 | 11/2023 | Heydari | |
| 2002/0159233 A1 | 10/2002 | Patel et al. | |
| 2005/0150637 A1 | 7/2005 | Tan et al. | |
| 2007/0227756 A1 | 10/2007 | Doerr et al. | |
| 2009/0146294 A1 | 6/2009 | Hillman et al. | |
| 2009/0205590 A1 | 8/2009 | Vetrovec | |
| 2009/0260777 A1 | 10/2009 | Attlesey | |
| 2010/0103620 A1 | 4/2010 | Campbell et al. | |
| 2010/0108292 A1 | 5/2010 | Bhunia et al. | |
| 2010/0118494 A1 | 5/2010 | Campbell et al. | |
| 2010/0328889 A1 | 12/2010 | Campbell et al. | |
| 2011/0026776 A1 | 2/2011 | Liang et al. | |
| 2011/0028617 A1 | 2/2011 | Hill et al. | |
| 2011/0267768 A1 | 11/2011 | Attlesey | |
| 2011/0284194 A1 | 11/2011 | Sarkar et al. | |
| 2011/0286177 A1 | 11/2011 | Attlesey | |
| 2011/0317367 A1 | 12/2011 | Campbell et al. | |
| 2012/0007579 A1 | 1/2012 | Apblett et al. | |
| 2012/0075797 A1 | 3/2012 | Attlesey | |
| 2012/0120599 A1 | 5/2012 | Chua et al. | |
| 2013/0105120 A1 | 5/2013 | Campbell et al. | |
| 2014/0123492 A1 | 5/2014 | Campbell et al. | |
| 2014/0218845 A1 | 8/2014 | Peng et al. | |
| 2014/0218861 A1 | 8/2014 | Shelnutt et al. | |
| 2015/0109730 A1 | 4/2015 | Campbell et al. | |
| 2015/0237767 A1 | 8/2015 | Shedd et al. | |
| 2015/0330718 A1 | 11/2015 | St Rock et al. | |
| 2016/0305565 A1 | 10/2016 | Miller et al. | |
| 2016/0330874 A1 | 11/2016 | Sato et al. | |
| 2016/0360637 A1 | 12/2016 | Harvilchuck et al. | |
| 2017/0105313 A1 | 4/2017 | Shedd et al. | |
| 2017/0127565 A1 | 5/2017 | Campbell et al. | |
| 2017/0181328 A1 | 6/2017 | Shelnutt et al. | |
| 2017/0265328 A1 | 9/2017 | Sasaki et al. | |
| 2018/0008467 A1 | 1/2018 | Cater et al. | |
| 2018/0027695 A1 | 1/2018 | Wakino et al. | |
| 2018/0042138 A1 | 2/2018 | Campbell et al. | |
| 2018/0070477 A1 * | 3/2018 | Saito | H05K 7/20 |
| 2018/0084671 A1 | 3/2018 | Matsumoto et al. | |
| 2018/0092243 A1 * | 3/2018 | Saito | G06F 1/206 |
| 2018/0153058 A1 | 5/2018 | Hirai et al. | |
| 2018/0196484 A1 | 7/2018 | Saito | |
| 2018/0246550 A1 * | 8/2018 | Inaba | H05K 7/20254 |
| 2018/0295745 A1 | 10/2018 | De Meijer et al. | |
| 2018/0338388 A1 * | 11/2018 | Wei | H05K 7/20781 |
| 2019/0014685 A1 | 1/2019 | So et al. | |
| 2019/0090383 A1 | 3/2019 | Tufty et al. | |
| 2019/0098796 A1 | 3/2019 | Wakino et al. | |
| 2019/0218101 A1 | 7/2019 | Huang et al. | |
| 2019/0223324 A1 | 7/2019 | Le et al. | |
| 2019/0297747 A1 | 9/2019 | Wakino et al. | |
| 2020/0025451 A1 | 1/2020 | Stone et al. | |

(56) References Cited

U.S. PATENT DOCUMENTS

| | | | |
|---|---|---|---|
| 2020/0093037 A1 | 3/2020 | Enright et al. | |
| 2020/0196489 A1 | 6/2020 | Chang et al. | |
| 2020/0214169 A1 | 7/2020 | Tsunoda | |
| 2020/0267872 A1 | 8/2020 | Harada et al. | |
| 2020/0288600 A1 | 9/2020 | Gao | |
| 2020/0305307 A1 | 9/2020 | Amos et al. | |
| 2020/0323100 A1 | 10/2020 | Chiu et al. | |
| 2020/0323108 A1 | 10/2020 | Bilan et al. | |
| 2020/0389998 A1 | 12/2020 | Tung et al. | |
| 2020/0390007 A1 | 12/2020 | Edmunds et al. | |
| 2021/0051815 A1 | 2/2021 | Van et al. | |
| 2021/0076531 A1 | 3/2021 | Tung et al. | |
| 2021/0102294 A1* | 4/2021 | Miljkovic | C23C 14/205 |
| 2021/0112683 A1 | 4/2021 | Mohajer et al. | |
| 2021/0185850 A1 | 6/2021 | Kulkarni et al. | |
| 2021/0321526 A1 | 10/2021 | Kulkarni et al. | |
| 2021/0327787 A1 | 10/2021 | Yang et al. | |
| 2021/0385971 A1 | 12/2021 | Gorius et al. | |
| 2021/0410292 A1 | 12/2021 | Yang et al. | |
| 2021/0410319 A1 | 12/2021 | Manousakis et al. | |
| 2021/0410320 A1 | 12/2021 | Yang et al. | |
| 2021/0410328 A1 | 12/2021 | Yang et al. | |
| 2022/0256744 A1* | 8/2022 | Le | H05K 7/20318 |

FOREIGN PATENT DOCUMENTS

| | | |
|---|---|---|
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | I 678 961 B | 12/2019 |
| WO | 2011006150 A1 | 1/2011 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020/234600 A1 | 11/2020 |
| WO | 2020223806 A1 | 11/2020 |
| WO | 2020234600 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.

"IBM's Hot-Water Supercomputer Goes Live", Data Center Knowledge, retrieved on Jul. 19, 2021, 9 pages.

Extended European Search Report with regard to the EP Patent Application No. 21306771.3 completed May 23, 2022.

Extended European Search Report with regard to the EP Patent Application No. 21306173.2 completed Feb. 18, 2022.

Extended European Search Report with regard to the EP Patent Application No. 21306174.0 completed Feb. 14, 2022.

Extended European Search Report with regard to the EP Patent Application No. 21306172.4 completed Feb. 15, 2022.

English Abstract for JP2020065002 retrieved on Espacenet on Jun. 2, 2022.

Extended European Search Report with regard to the EP Patent Application No. 21306186.4 completed Feb. 10, 2022.

Extended European Search Report with regard to the EP Patent Application No. 21306187.2 completed Feb. 10, 2022.

Extended European Search Report with regard to the EP Patent Application No. 21306175.7 completed Apr. 8, 2022.

Extended European Search Report with regard to the EP Patent Application No. 21306188.0 completed Feb. 10, 2022.

English Abstract for JPH043451 retrieved on Feb. 22, 2022.

Extended European Search Report with regard to the EP Patent Application No. 21306171.6 completed Feb. 11, 2022.

Extended European Search Report with regard to the EP Patent Application No. 21306189.8 completed Feb. 10, 2022.

Extended European Search Report with regard to the EP Patent Application No. 21306170.8 completed Feb. 12, 2022.

English Abstract for NL 1006486 retrieved on Espacenet on Jun. 3, 2022.

Office Action with regard to the counterpart U.S. Appl. No. 17/697,452 dated May 11, 2023.

Notice of Allowance with regard to the counterpart U.S. Appl. No. 17/691,494 dated Apr. 17, 2023.

Office Action with regard to the counterpart U.S. Appl. No. 17/698,480 dated Sep. 7, 2023.

International Search Report and Written Opinion with regard to PCTIB2022053071 dated Jun. 28, 2022.

International Search Report and Written Opinion with regard to PCT/IB2022/052975 dated Jun. 20, 2022.

International Search Report and Written Opinion with regard to PCTIB2022052330 dated May 30, 2022.

International Search Report and Written Opinion with regard to PCT/IB2022/052976 dated Jun. 17, 2022.

International Search Report and Written Opinion with regard to PCT/IB2022/052977 dated Jun. 20, 2022.

European Search Report with regard to EP21306170.8 dated Feb. 12, 2022.

European Search Report with regard to EP21306189.8 dated Feb. 10, 2022.

Office Action with regard to the counterpart U.S. Appl. No. 17/694,765 dated Dec. 21, 2023.

Office Action with regard to the counterpart U.S. Appl. No. 17/697,264 dated Nov. 22, 2023.

Office Action with regard to the counterpart U.S. Appl. No. 17/697,452 dated Nov. 22, 2023.

* cited by examiner

HYBRID IMMERSION COOLING SYSTEM FOR RACK-MOUNTED ELECTRONIC ASSEMBLIES

CROSS-REFERENCE TO RELATED APPLICATIONS

This application claims benefit to European Application No. EP 21305427.3, entitled "IMMERSION COOLING CONCEPTS FOR SERVERS", filed on Apr. 1, 2021, and to European Application No. EP 21306171.6, entitled "HYBRID IMMERSION COOLING SYSTEM FOR RACK-MOUNTED ELECTRONIC ASSEMBLIES", filed on Aug. 30, 2021, the contents of both of which are incorporated by reference herein in their entirety.

FIELD

The present disclosure generally relates to the cooling of rack-mounted electronic equipment and, in particular, to a hybrid liquid cooling system for such equipment.

BACKGROUND

Electronic equipment such as, for example, processing servers, memory storage systems, etc. are typically arranged in equipment racks. Large computing facilities servicing the increased demand for processing resources may contain thousands of racks to support such electronic equipment.

Such electronic equipment racks, including support equipment mounted on their backplanes, consume large amounts of electric power for proper operations which, in turn, results in the generation of substantial amounts of heat. For example, certain components of electronic assemblies, such as, processing units, generate so much heat during operations that they are susceptible to failure within seconds without adequate cooling. Accordingly, cooling measures/techniques are of particular import to electronic equipment racks.

In conventional implementations, fans are mounted within the electronic equipment racks to provide forced-air cooling to the rack-mounted equipment housing electronic assemblies. However, this implementation merely displaces some of the heat generated within the rack-mounted equipment to the general ambient environment which, in turn, requires further ambient cooling measures.

Recently, liquid cooling methods have been introduced as an addition and/or alternative to conventional fan forced-air cooling of electronic equipment racks. One such method is a direct cooling plate block technique that comprises cooling plate blocks having internal channels for circulating cooled water that are directly mounted to heat-generating electronic components, such as processing units, to displace the heat generated therefrom towards mounted heat-exchanging units. In turn, the mounted heat-exchanging units may employ finned tubes or plate structures having relatively large surface areas to adequately displace heat (e.g., in similar fashion to radiators) away from the electronic components.

Another liquid cooling method is an immersion cooling technique, in which electronic components are fully submerged in a casing containing a non-conductive cooling liquid, such as, for example, an oil-based dielectric cooling liquid. The immersion of the electronic components achieves adequate thermal contact between the electronic components and the dielectric cooling liquid. However, certain electronic components, such as, for example, processing units tend to generate more heat than other devices, such as, for example, memory boards.

As such, the immersion cooling technique generally requires circulation of the dielectric cooling liquid within the casing that is maintained at a lower temperature level sufficient to cool the hotter generating electronic components. To do so, the immersion cooling technique typically employs pumps, heat sink structures, heat exchangers, sealed evaporative equipment, etc. that either consume large amounts of energy to operate, require sealed casings with environmentally unfriendly chemicals, or occupy relatively large surface areas that limit the number of electronic components that can be implemented.

Even though the recent developments noted above have shown to provide some limited benefits, improvements are still desirable in achieving higher efficiencies and increasing the overall cooling performance of rack-mounted liquid-cooled electronic assemblies.

The subject matter discussed in the background section should not be assumed to be prior art merely as a result of its mention in the background section. Similarly, a problem mentioned in the background section or associated with the subject matter of the background section should not be assumed to have been previously recognized in the prior art.

SUMMARY

The embodiments of the present disclosure are provided based on developers' understanding of the limitations associated with the prior art, in achieving higher efficiencies, increasing the overall cooling performance of rack-mounted liquid-cooled electronic assemblies, and improving the power consumption of such electronic assemblies.

In addressing such limitations, the embodiments of the present disclosure provides a hybrid liquid cooling system (100) for at least one rack-mounted immersion case (104) housed within a rack frame (102) in which the at least one immersion case (104) contains a volume of dielectric immersion cooling liquid (106) and at least one electronic assembly (108) submerged in the dielectric immersion cooling liquid (106) in which the at least one electronic assembly (108) comprises one or more one heat-generating electronic processing component (110, 112).

The hybrid liquid cooling system (100) further comprises a closed-loop fluid distribution arrangement (134) configured to circulate channelized fluid to and from fluidly-coupled elements associated with at least one immersion case (104) and an external cooling module (130) configured to thermally condition the channelized fluid circulated by the closed-loop fluid distribution arrangement (134). The external cooling module (130) comprises a fluidly-coupled input configured to receive the higher-temperature channelized fluid via the closed-loop fluid distribution arrangement (134) and a fluidly-coupled output configured to forward the conditioned lower-temperature channelized fluid via the closed-loop fluid distribution arrangement (134).

The hybrid liquid cooling system (100) further comprises a serpentine convection coil (120) submerged within the dielectric immersion cooling liquid (106) and separately disposed from the at least one electronic assembly (108), the serpentine convection coil (120) configured with a fluidly-coupled upper port and a fluidly-coupled lower port to fluidly communicate with the closed-loop fluid distribution arrangement (134), the serpentine convection coil (120) structured to internally convey the channelized fluid to operatively cool ambient temperatures of the dielectric immersion cooling liquid (106) through thermal convection flow based on the lower-temperature channelized fluid provided by the cooling module (130) via the closed-loop fluid distribution arrangement (134).

The hybrid liquid cooling system (100) also comprises one or more fluid cooling blocks (110A, 112A) arranged to be in direct thermal contact with the one or more heat-generating electronic processing components (110, 112), the one or more fluid cooling blocks (110A, 112A) fluidly-coupled to the closed-loop fluid distribution arrangement (134) and configured to cool the one or more heat-generating electronic processing components (110, 112) based on the lower-temperature channelized fluid forwarded by the cooling module (130) via the closed-loop fluid distribution arrangement (134).

In various aspects of the present disclosure, the closed-loop fluid distribution arrangement (134) of the hybrid liquid cooling system (100) comprises a tube channel network (136) configured to facilitate the circulation of channelized fluid between the fluidly-coupled serpentine convection coil (120), the fluidly-coupled one or more fluid cooling blocks (110A, 112A), and the fluidly-coupled external cooling module (130). The tube channel network may be constructed from flexible materials (e.g., rubber, plastic, etc.), rigid materials (e.g., metal, PVC piping, etc.), or any combination of such materials.

In certain implementations consistent with the present disclosure, the tube channel network (136) is structured to route the lower-temperature channelized fluid from the external cooling module (130) to at least one fluid cooling block (110A) and route a resulting higher-temperature channelized fluid output from the at least one cooling block (112A) to the upper port of the serpentine convection coil (120), wherein the lower port of the serpentine convection coil (120) forwards the higher-temperature channelized fluid to the external cooling module (130) for thermal conditioning into the lower-temperature channelized fluid.

In certain implementations consistent with the present disclosure, the tube channel network (136) is structured to route the lower-temperature channelized fluid from the external cooling module (130) to at least one fluid cooling block (110A) and route a resulting higher-temperature channelized fluid output from the at least one fluid cooling block (110A) to the lower port of the serpentine convection coil (120), wherein the upper port of the serpentine convection coil (120) forwards the higher-temperature channelized fluid to the external cooling module (130) for thermal conditioning into the lower-temperature channelized fluid.

In certain implementations consistent with the present disclosure, the tube channel network (136) is structured to route the lower-temperature channelized fluid from the external cooling module (130) to the lower port of the serpentine convection coil (120) and route the lower-temperature channelized fluid from the upper port of the serpentine convection coil (120) to at least one fluid cooling block (110A), wherein a resulting higher-temperature channelized fluid output from the at least one fluid cooling block (110A) is forwarded to the external cooling module (130) for thermal conditioning into the lower-temperature channelized fluid.

In certain implementations consistent with the present disclosure, the tube channel network (136) is structured to route the lower-temperature channelized fluid from the external cooling module (130) to the upper port of the serpentine convection coil (120) and route the lower-temperature channelized fluid from the lower portion port of the serpentine convection coil (120) to at least one fluid cooling block (110A), wherein a resulting higher-temperature channelized fluid output from the at least one fluid cooling block (110A) is forwarded to the external cooling module (130) for thermal conditioning into the lower-temperature channelized fluid.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE FIGURES

Further features and advantages of the present disclosure will become apparent from the following detailed description, taken in combination with the appended drawings, in which.

DETAILED DESCRIPTION

The instant disclosure is directed to address at least some of the deficiencies of the current technology. In particular, the instant disclosure presents a hybrid liquid-cooling system for at least one rack-mounted immersion case containing at least one electronic assembly submerged in dielectric immersion cooling liquid.

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

With these fundamentals in place, we will now consider some non-limiting examples to illustrate various implementations of aspects of the present disclosure.

Figure 1:
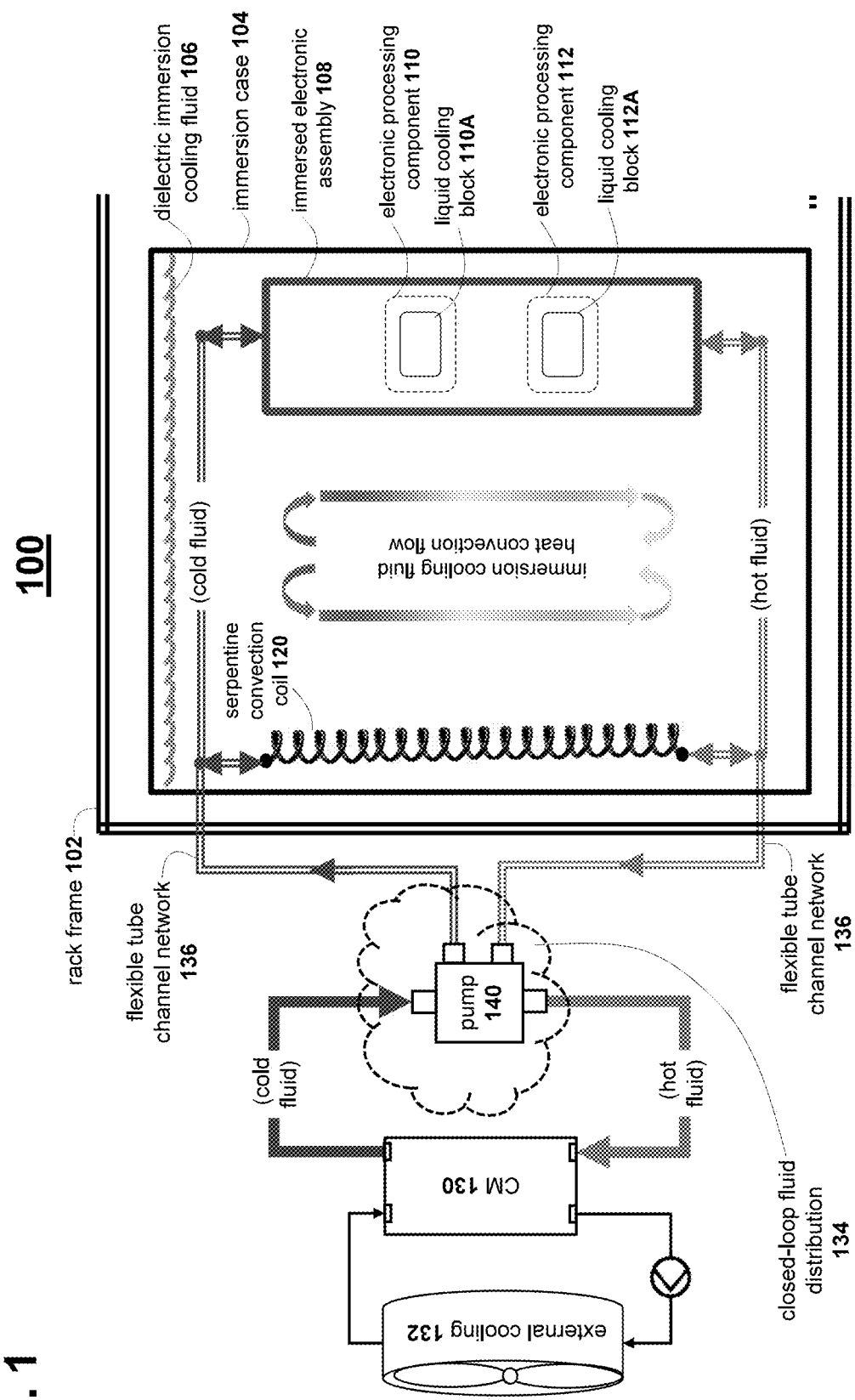
FIG. 1 is a conceptual block diagram of a hybrid liquid cooling system, in accordance with the embodiments of the present disclosure.

In particular, FIG. 1 depicts a conceptual block diagram of a hybrid liquid cooling system 100, in accordance with the embodiments of the present disclosure. The hybrid liquid-cooling system 100 is configured to provide a novel integration of specific immersion-cooling and direct channelized liquid-cooling fluid techniques.

With this said, FIG. 1 shows that hybrid liquid-cooling system 100 comprises a rack frame 102 that houses at least one rack-mounted immersion case 104 containing a volume of non-conductive dielectric immersion fluid 106 and at least one electronic assembly 108 that is submerged in the dielectric immersion cooling liquid 106.

For illustrative purposes and ease of understanding only, the figures depict a single rack-mounted immersion case 104 and a single electronic assembly 108. Such depictions should not be interpreted as being limiting, as the inventive concepts presented herein cover and contemplate the use of multiple immersion cases 104 and/or multiple electronic assemblies 108.

By having electronic assembly 108 submerged in the dielectric immersion cooling liquid 106, rack-mounted immersion case 104 provides immersion-cooling of electronic assembly 108. Specifically, submerged electronic assembly 108 may contain processing, RAM, ROM, hard disk drives, etc. components. By being submerged, the electronic assembly 108 components are arranged to come in direct contact with the dielectric immersion cooling liquid 106, thereby effectively reducing the operating temperatures of such components.

The rack-mounted immersion case 104 may also contain a serpentine convection coil 110 that is also submerged within the dielectric immersion cooling liquid 106. The serpentine convection coil 110 is structured with multiple hollow-channel coils to provide a high surface area exposure relative to the dielectric immersion cooling liquid 106 while also maintaining compact overall length and width dimensions. The serpentine convection coil 110 is also structured with a fluidly-coupled upper port and a fluidly-coupled lower port.

With this structure, serpentine convection coil 110 is configured to cool the ambient temperature and induce thermal convection in the the dielectric immersion cooling liquid 106 through direct channelized liquid-cooling. That is, serpentine convection coil 110 internally conveys a circulating channelized cooling fluid that operates to cool the dielectric immersion cooling liquid 106. It is to be understood that the channelized cooling fluid may consist of a different liquid from the dielectric immersion cooling liquid 106. That is, the channelized cooling fluid may comprise water, alcohol, or any suitable liquid capable of sustaining adequate cooling temperatures.

Moreover, in an effort to optimize the thermal convection flow of the dielectric immersion cooling liquid 106, serpentine convection coil 120 may be strategically positioned separate from electronic assembly 108 while in an area within immersion case 104 approximate to the relative locations of heat-generating components 110, 112 associated with electronic assembly 108.

As noted above, electronic assembly 108 comprises electronic components that are also submerged within dielectric immersion cooling liquid 106. In many implementations, at least one of the electronic components may comprise a heat-generating electronic processing component 110, 112. Such electronic processing heat-generating components 110, 112 may take the form of general processing units and/or specialized processing units. Examples of such processing units include, but are not limited to, central processing units (CPUs), graphics processing units (GPUs), neural processing units (NPUs), tensor processing units (TPUs), power supply circuitry, and application specific integrated circuits (ASICs), including, for example, ASICs configured for high-speed cryptocurrency mining.

In order to provide further cooling to these particularly heat-generating electronic processing components 110, 112, and as a supplement to the overall immersion cooling of electronic assembly 108 within rack-mounted immersion case 104, direct channelized liquid-cooling fluid may be implemented. That is, cooling blocks 110A, 112A may be arranged to be in direct thermal contact with the one or more heat-generating electronic processing components 110, 112. The fluid cooling blocks 110A, 112A are structured to convey the circulating channelized cooling fluid to provide additional cooling measures to heat-generating electronic processing components 110, 112.

Turning back to FIG. 1, hybrid liquid cooling system 100 further comprises a closed-loop fluid distribution arrangement 134. The closed-loop fluid distribution arrangement 134 operates to circulate lower temperature ("cool") channelized fluid, e.g. 30°-45° C., to components within the immersion case 104 and commensurately circulate higher temperature ("hot") channelized fluid, e.g. ≥50° C., back from those components. To this end, closed-loop fluid distribution arrangement 134 is structured with a tube channel network 136 arranged to provide the overall distribution and circulation of "cool" and "hot" channelized fluid to and from fluidly-coupled components within rack-mounted immersion case 104.

As shown, closed-loop fluid distribution arrangement 134 is fluidly-coupled to an external cooling module CM 130. The cooling module CM 130 is configured to thermally condition the higher temperature "hot" channelized fluid received from the fluidly-coupled components within rack-mounted immersion case 104, via tube channel network 136, into lower-temperature "cool" channelized fluid. The cooling module CM 130 is further configured to forward the conditioned lower-temperature "cool" channelized fluid to the fluidly-coupled components, via tube channel network 136.

As also shown, cooling module CM 130 is configured to fluidly communicate with an external cooling source 132 that operates to supply cooling module CM 130 with lower temperature fluid flow to facilitate the thermal conditioning by the external cooling module 130 of the higher-temperature channelized fluid into the lower-temperature channelized fluid. The external cooling source 132 may comprise an external cool water supply, a dry cooling unit, or any other suitable measure capable of providing adequate cooling temperature fluid flow to external cooling module 130 for proper thermal conditioning operations by external cooling module 130.

In addition, closed-loop fluid distribution arrangement 134 comprises at least one pump 140 that is fluidly-coupled to the external cooling module CM 130 to provide an adequate circulatory flow rate, e.g., 0.35-0.55 liters/min. In particular, pump 140 is configured to receive the higher-temperature "hot" channelized fluid from the higher temperature "hot" channelized fluid received from the fluidly-coupled components, such as, serpentine convection coil 110 and fluid cooling blocks 110A, 112A within rack-mounted immersion case 104, via tube channel network 136, and forward the "hot" channelized fluid to cooling module CM 130 for lower temperature conditioning.

The pump 140 is also configured to receive the conditioned lower temperature "cool" channelized fluid from cooling module CM 130 and forward, via tube channel network 136, the "cool" channelized fluid to the fluidly-coupled components within rack-mounted immersion case 104, such as, serpentine convection coil 110 and fluid cooling blocks 110A, 112A.

Therefore, the infrastructure of hybrid liquid-cooling system 100 described above provides for the circulation of lower-temperature "cool" channelized fluid from the external cooling module 130 to the fluidly-coupled serpentine convection coil 120 and/or the fluidly-coupled one or more fluid cooling blocks 110A, 112A for component cooling operations as well as the circulation higher-temperature "hot" channelized fluid from the fluidly-coupled serpentine convection coil 120 and/or the fluidly-coupled one or more fluid cooling blocks 110A, 112A back to the external cooling module 130 for conditioning into lower-temperature channelized fluid.

By virtue of the infrastructure, hybrid liquid-cooling system 100 is capable of maintaining a relatively narrow thermal variance between the input "cool" channelized fluid and the output "hot" channelized fluid of $\Delta T=20K$ as well as achieving a rack cooling partial Power Use Effectiveness (pPUE) equal to 1.00.

Given the overall hybrid liquid-cooling system 100 concept of integrating specific immersion-cooling and direct channelized liquid-cooling fluid techniques as presented above, the following descriptions detail various non-limiting implementations of the hybrid liquid-cooling system 100 that generally embody the disclosed concepts.

Figure 2:
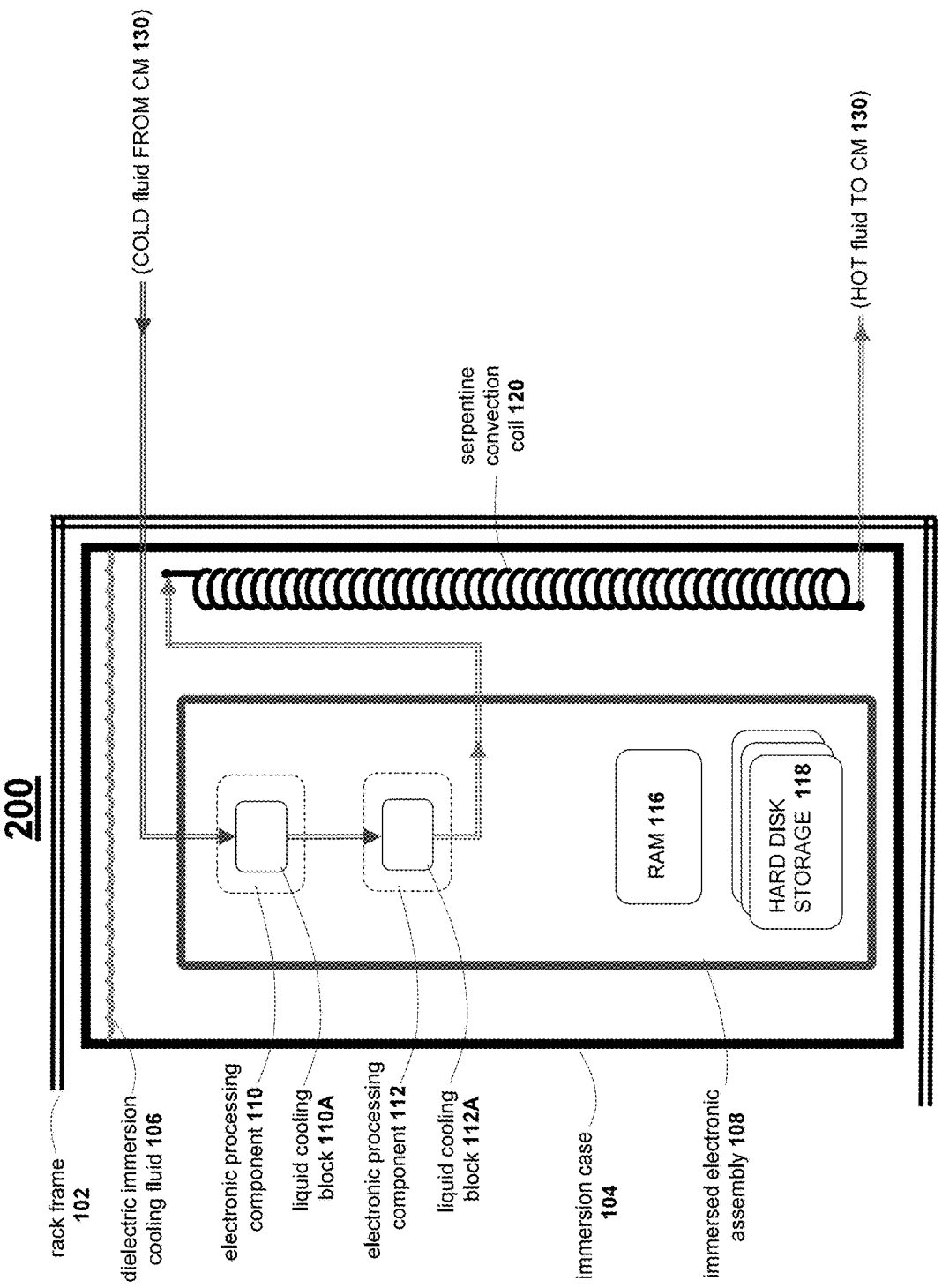
FIG. 2 is a functional block diagram of a hybrid liquid cooling system implementation, in accordance with the embodiments of the present disclosure.

FIG. 2 is a functional block diagram of a hybrid liquid cooling system implementation 200, in accordance with the embodiments of the present disclosure. FIG. 2 illustrates similar structural features as FIG. 1, so identical reference characters are used and the previous descriptions of such features and attributes are omitted for purposes of brevity.

FIG. 2 depicts hybrid liquid-cooling system implementation 200 that is configured to provide both the immersion-cooling and direct channelized liquid-cooling fluid techniques described above. The particular configuration of implementation 200 offers one solution for optimizing the liquid cooling of submerged components. Specifically, hybrid liquid-cooling system implementation 200 comprises immersion case 104 containing a volume of dielectric immersion fluid 106, submerged electronic assembly 108 having heat-generating electronic processing components 110, 112, submerged memory (RAM) 116, hard disk storage 118, and submerged serpentine convection coil 120.

In the hybrid liquid-cooling system implementation 200, the tube channel network 136 is structured to route the lower-temperature "cool" channelized fluid from the external cooling module 130 to at least one fluid cooling block 110A. The resulting higher-temperature "hot" channelized fluid output from the at least one cooling block 110A is then routed to the upper port of the serpentine convection coil 120. The lower port of the serpentine convection coil 120 subsequently forwards the higher-temperature channelized fluid to the external cooling module 130 for thermal conditioning and conversion into the lower-temperature channelized fluid.

Figure 3:
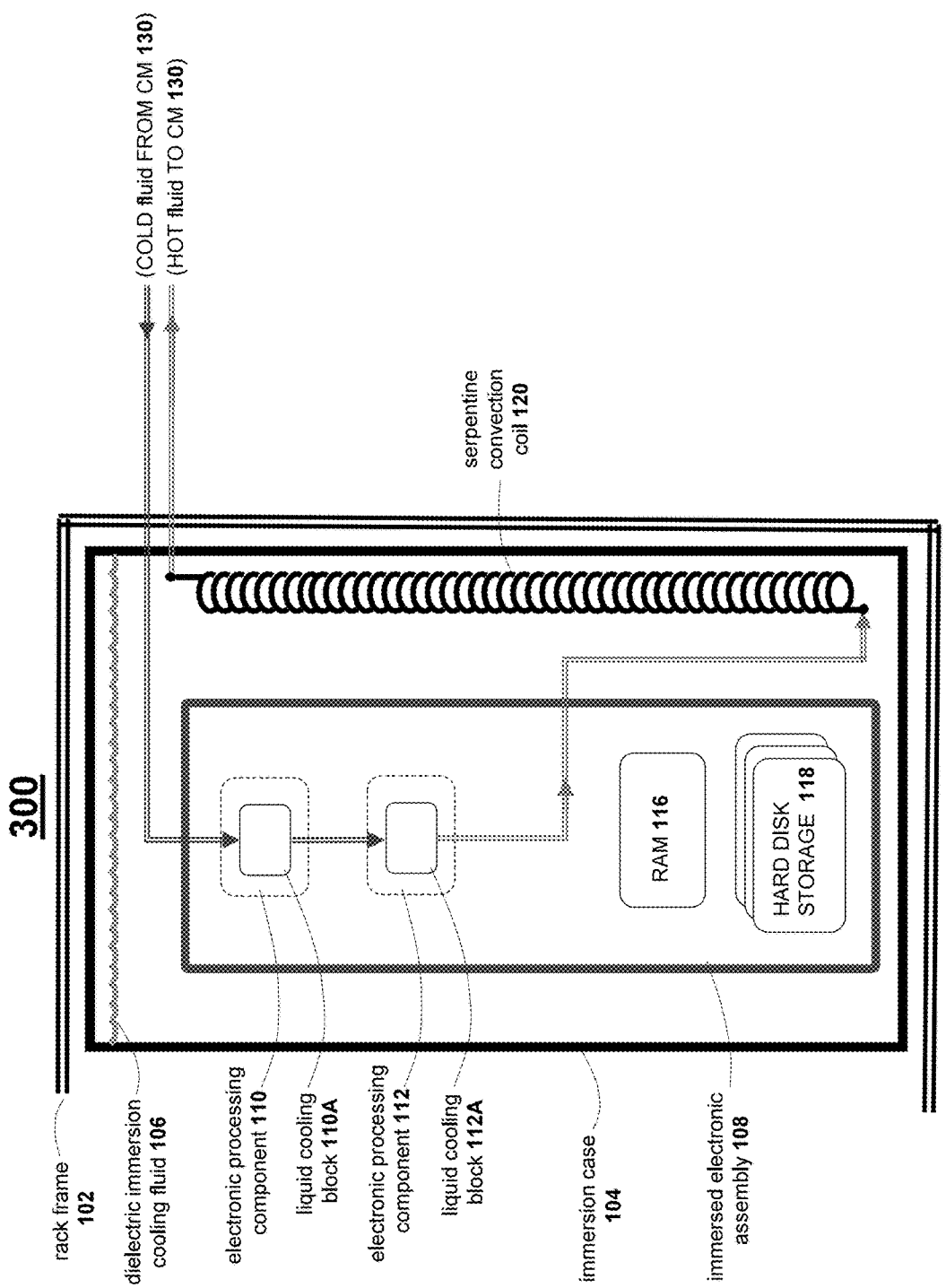
FIG. 3 is a functional block diagram of another hybrid liquid cooling system implementation, in accordance with the embodiments of the present disclosure.

FIG. 3 depicts hybrid liquid-cooling system implementation 300 that is also configured to provide both the immersion-cooling and direct channelized liquid-cooling fluid techniques described above. The particular configuration of implementation 300 offers another solution for optimizing the liquid cooling of submerged components.

Like implementation 200, hybrid liquid-cooling system implementation 300 comprises immersion case 104 containing a volume of dielectric immersion fluid 106, submerged electronic assembly 108 having heat-generating electronic processing components 110, 112, submerged memory (RAM) 116, hard disk storage 118, and submerged serpentine convection coil 120. However, in hybrid liquid-cooling system implementation 300, the tube channel network 136 is structured to route the lower-temperature "cool" channelized fluid from the external cooling module 130 to at least one fluid cooling block 110A. The resulting higher-temperature "hot" channelized fluid output from the fluid cooling block 110A is then routed to the lower port of the serpentine convection coil 120. The upper port of the serpentine convection coil 120 subsequently forwards the higher-temperature channelized fluid to the external cooling module 130 for thermal conditioning/conversion into the lower-temperature channelized fluid.

Figure 4:
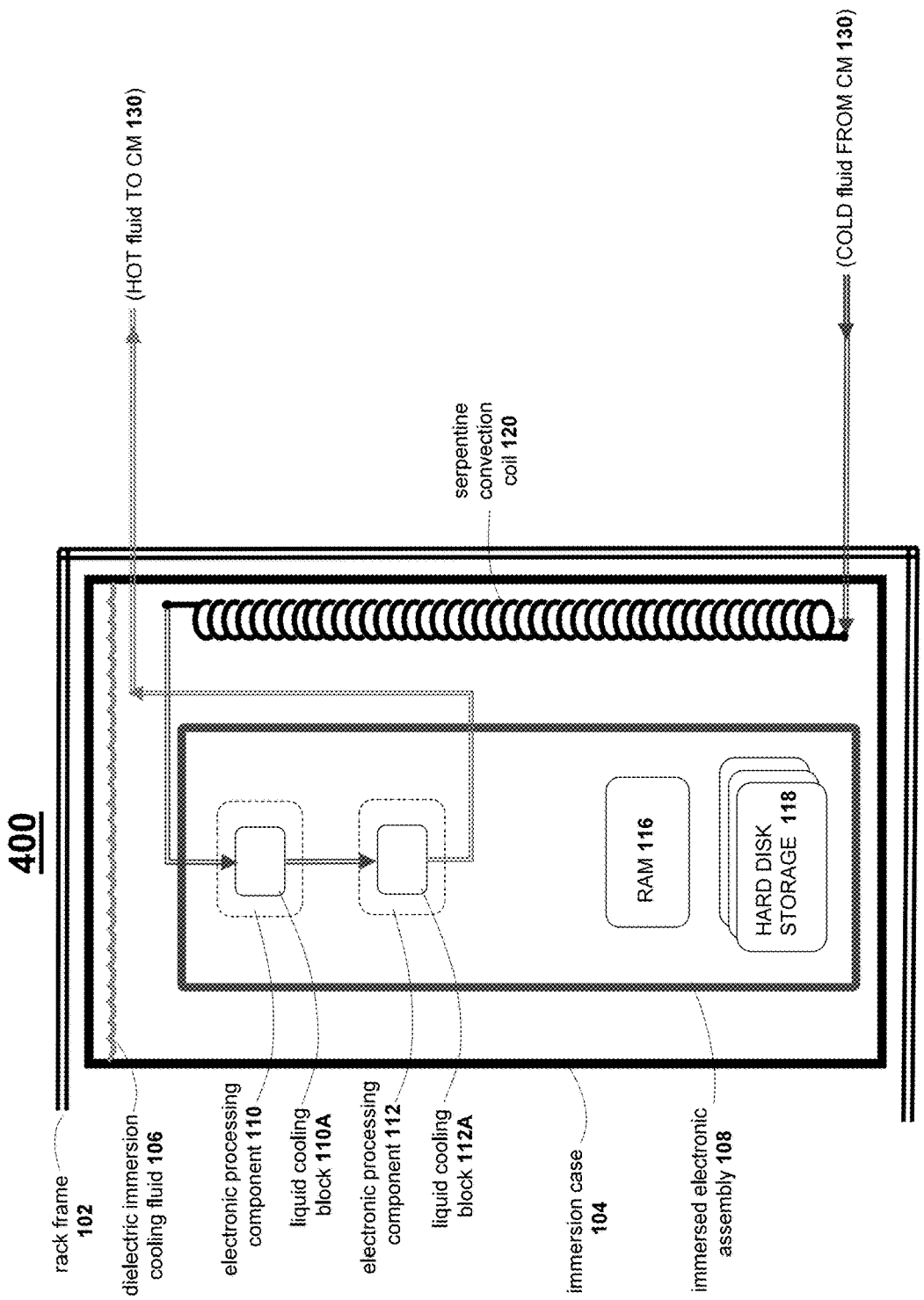
FIG. 4 is a functional block diagram of yet another hybrid liquid cooling system implementation, in accordance with the embodiments of the present disclosure.

FIG. 4 depicts hybrid liquid-cooling system implementation 400 that is also configured to provide both the immersion-cooling and direct channelized liquid-cooling fluid techniques described above. The particular configuration of implementation 400 offers another solution for optimizing the liquid cooling of submerged components.

Like implementations 200, 300 hybrid liquid-cooling system implementation 400 comprises immersion case 104 containing a volume of dielectric immersion fluid 106, submerged electronic assembly 108 having heat-generating electronic processing components 110, 112, submerged memory (RAM) 116, hard disk storage 118, and submerged serpentine convection coil 120. However, in hybrid liquid-cooling system implementation 400, the tube channel network 136 is structured to route the lower-temperature "cool" channelized fluid from the external cooling module 130 to the lower port of the serpentine convection coil 120. The lower-temperature channelized fluid is then routed from the upper port of the serpentine convection coil 120 to at least one fluid cooling block 110A. The resulting higher-temperature "hot" channelized fluid output from the fluid cooling block 110A is subsequently forwarded to the external cooling module 130 for thermal conditioning/conversion into the lower-temperature channelized fluid.

Figure 5:
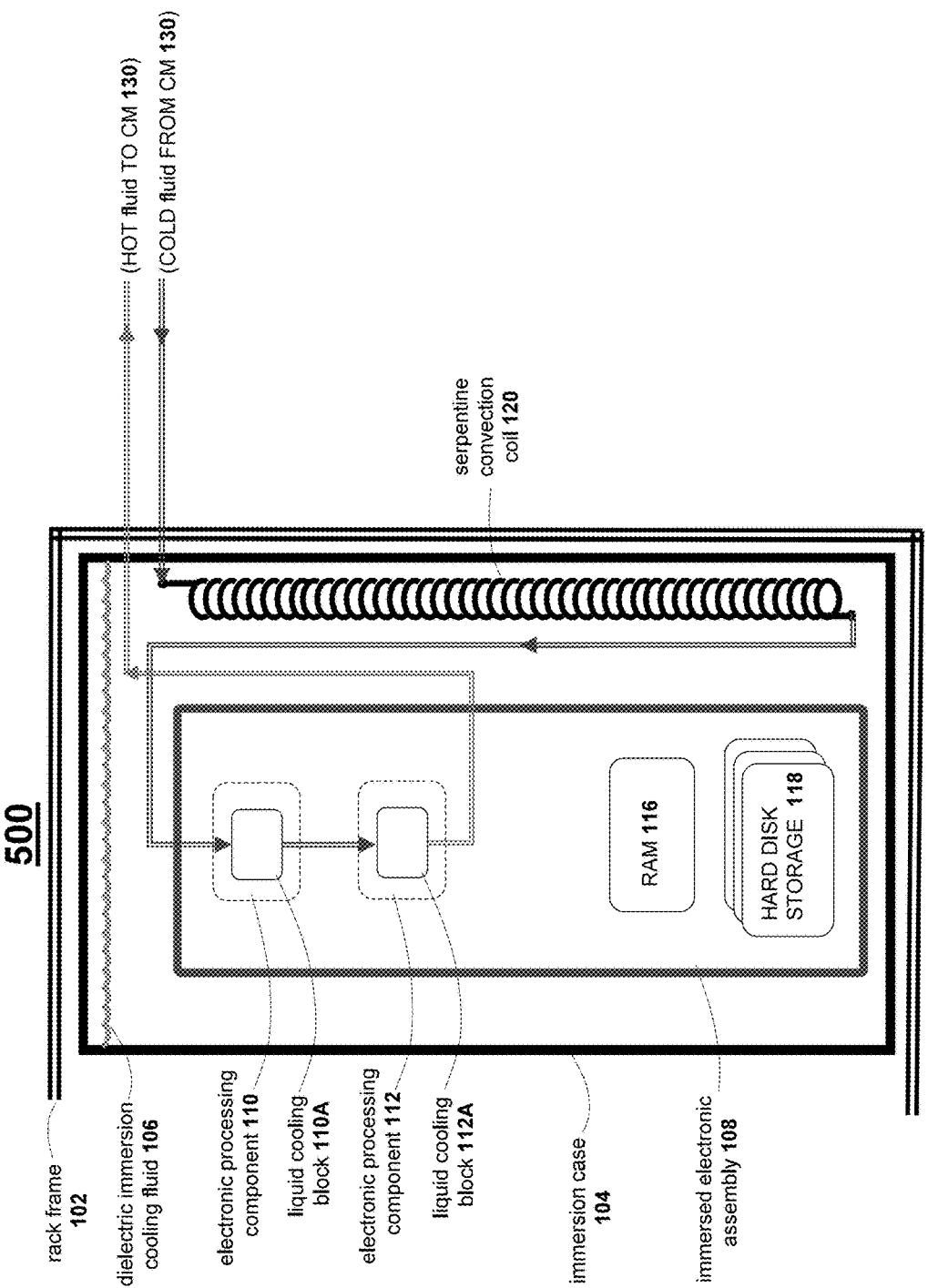
FIG. 5 is a functional block diagram of an additional hybrid liquid cooling system implementation, in accordance with the embodiments of the present disclosure.

FIG. 5 depicts hybrid liquid-cooling system implementation 500 that is also configured to provide both the immersion-cooling and direct channelized liquid-cooling fluid techniques described above. The particular configuration of implementation 500 offers yet another solution for optimizing the liquid cooling of submerged components.

Like implementations 200, 300, 400 hybrid liquid-cooling system implementation 500 comprises immersion case 104 containing a volume of dielectric immersion fluid 106, submerged electronic assembly 108 having heat-generating electronic processing components 110, 112, submerged memory (RAM) 116, hard disk storage 118, and submerged serpentine convection coil 120. However, in hybrid liquid-cooling system implementation 500, the tube channel network 136 is structured to route the lower-temperature "cool" channelized fluid from the external cooling module 130 to the upper port of the serpentine convection coil 120. The lower-temperature channelized fluid from the lower portion port of the serpentine convection coil 120 is then routed to at least one fluid cooling block 110A. The resulting higher-temperature "hot" channelized fluid output from the fluid cooling block 110A is subsequently forwarded to the external cooling module 130 for thermal conditioning/conversion into the lower-temperature channelized fluid.

It will be appreciated that hybrid liquid-cooling system implementations 200, 300, 400, 500 may comprise more than one fluid cooling block 110A. That is, as shown, implementations 200, 300, 400, 500 may comprise first fluid cooling block 110A and a second fluid cooling block 112A that are fluidly-coupled in series with each other to maintain the closed-loop connectivity of closed-loop fluid distribution arrangement 134.

Figure 7:
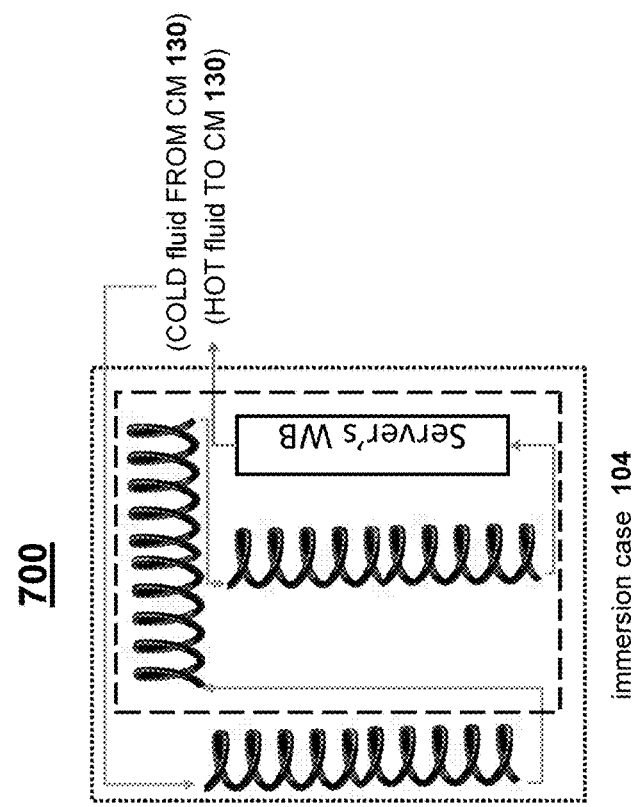
FIGS. 6, 7 are conceptual views of a hybrid liquid cooling system containing multiple serpentine convection coils, in accordance with the embodiments of the present disclosure.
Figure 6:
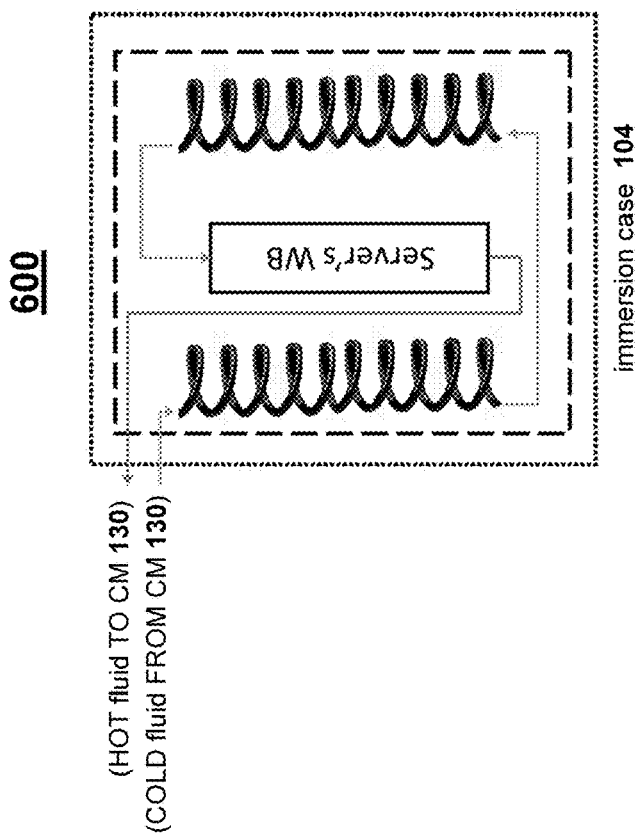

It is contemplated that some operational environments and equipment implementations may require additional immersion cooling measures. Accordingly, FIGS. 6, 7 provide conceptual views of hybrid liquid cooling system configurations, 600, 700, respectively containing multiple serpentine convection coils, in accordance with the embodiments of the present disclosure. As shown, configurations, 600, 700 indicate the respective routing of the channelized liquid-cooling fluid to and from cooling module 130 and between the serpentine coils to maintain the closed-loop connectivity of closed-loop fluid distribution arrangement 134.

It is further contemplated that the infrastructure of hybrid liquid-cooling system implementations 200, 300, 400, 500 allows for hot water recycling measures by repurposing the higher-temperature channelized fluid to assist in the operations of other heat generating mechanisms, such as, for example, boilers, engine cogeneration, carbon filter plants, etc.

With this said, it will be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A hybrid liquid cooling system for at least one rack-mounted immersion case housed within a rack frame, comprising:
the at least one immersion case containing a volume of dielectric immersion cooling liquid and at least one electronic assembly submerged in the dielectric immersion cooling liquid, the at least one electronic assembly comprising one or more one heat-generating electronic processing components;
a closed-loop fluid distribution arrangement configured to circulate channelized fluid to and from fluidly-coupled elements associated with the at least one immersion case, the closed-loop fluid distribution arrangement comprising a tube channel network;
an external cooling module configured to thermally condition the channelized fluid circulated by the closed-loop fluid distribution arrangement in which the channelized fluid having a higher temperature is conditioned into channelized fluid having a lower temperature, the external cooling module comprising a fluidly-coupled input configured to receive the higher-temperature channelized fluid via the closed-loop fluid distribution arrangement and a fluidly-coupled output configured to forward the conditioned lower-temperature channelized fluid via the closed-loop fluid distribution arrangement;
a serpentine convection coil, comprising a plurality of helical coils, that is submerged in a vertical orientation within the dielectric immersion cooling liquid and separately disposed from the at least one electronic assembly, the vertically-oriented serpentine convection coil configured with a fluidly-coupled upper port and a fluidly-coupled lower port to fluidly communicate with the closed-loop fluid distribution arrangement, the vertically-oriented serpentine convection coil structured to internally convey the channelized fluid to operatively cool ambient temperatures of the dielectric immersion cooling liquid via thermal convection flow and the lower-temperature channelized fluid forwarded by the cooling module via the closed-loop fluid distribution arrangement; and
one or more fluid cooling blocks arranged to be in direct thermal contact with the one or more heat-generating electronic processing components, the one or more fluid cooling blocks fluidly-coupled to the closed-loop fluid distribution arrangement and configured to cool the one or more heat-generating electronic processing components based on the lower-temperature channelized fluid forwarded by the cooling module via the closed-loop fluid distribution arrangement.

2. The hybrid liquid cooling system of claim 1, further comprising an external cooling source configured to provide lower temperature fluid flow to the external cooling module to facilitate the thermal conditioning by the external cooling module of the higher-temperature channelized fluid into the lower-temperature channelized fluid.

3. The hybrid liquid cooling system of claim 2, wherein the external cooling source comprises a dry cooling unit configured to provide lower temperature air flow to the external cooling module.

4. The hybrid liquid cooling system of claim 1, wherein the tube channel network of the closed-loop fluid distribution arrangement is configured to facilitate the circulation of the channelized fluid between the fluidly-coupled serpentine convection coil, the fluidly-coupled one or more fluid cooling blocks, and the fluidly-coupled external cooling module.

5. The hybrid liquid cooling system of claim 1, wherein the closed-loop fluid distribution arrangement comprises at least one pump fluidly-coupled to the external cooling module and the tube channel network and configured to displace and circulate the channelized fluid.

6. The hybrid liquid cooling system of claim 1, wherein the one or more one heat-generating electronic processing components comprise general processing units and/or specialized processing units.

7. The hybrid liquid cooling system of claim 1, wherein the at least one electronic assembly comprises one or more random access memory units and/or one or more hard disk storage units.

8. The hybrid liquid cooling system of claim 1, wherein the vertically-oriented serpentine convection coil is structured to have a compact overall length and width dimensions, in which the compact length is greater than the compact width.

9. The hybrid liquid cooling system of claim 1, wherein the vertically-oriented serpentine convection coil is positioned adjacent to locations of the one or more heat-generating electronic processing components disposed on the at least one electronic assembly.

10. The hybrid liquid cooling system of claim 1, wherein the tube channel network is configured to:
circulate the lower-temperature channelized fluid from the external cooling module to the fluidly-coupled vertically-oriented serpentine convection coil and/or the fluidly-coupled one or more fluid cooling blocks for cooling operations, and
circulate the higher-temperature channelized fluid from the fluidly-coupled vertically-oriented serpentine convection coil and/or the fluidly-coupled one or more fluid cooling blocks back to the external cooling module for conditioning into the lower-temperature channelized fluid.

11. The hybrid liquid cooling system of claim 1, wherein the tube channel network is structured to:
route the lower-temperature channelized fluid from the external cooling module to at least one fluid cooling block; and
route a resulting higher-temperature channelized fluid output from the at least one cooling block to the upper port of the vertically-oriented serpentine convection coil,
wherein the lower port of the vertically-oriented serpentine convection coil forwards the higher-temperature channelized fluid to the external cooling module for thermal conditioning into the lower-temperature channelized fluid.

12. The hybrid liquid cooling system of claim 1, wherein the tube channel network is structured to:
route the lower-temperature channelized fluid from the external cooling module to at least one fluid cooling block; and
route a resulting higher-temperature channelized fluid output from the at least one fluid cooling block to the lower port of the vertically-oriented serpentine convection coil,
wherein the upper port of the vertically-oriented serpentine convection coil forwards the higher-temperature channelized fluid to the external cooling module for thermal conditioning into the lower-temperature channelized fluid.

13. The hybrid liquid cooling system of claim 1, wherein the tube channel network is structured to:
route the lower-temperature channelized fluid from the external cooling module to the lower port of the vertically-oriented serpentine convection coil; and
route the lower-temperature channelized fluid from the upper port of the vertically-oriented serpentine convection coil to at least one fluid cooling block,
wherein a resulting higher-temperature channelized fluid output from the at least one fluid cooling block is forwarded to the external cooling module for thermal conditioning into the lower-temperature channelized fluid.

14. The hybrid liquid cooling system of claim 1, wherein the tube channel network is structured to:
route the lower-temperature channelized fluid from the external cooling module to the upper port of the vertically-oriented serpentine convection coil; and
route the lower-temperature channelized fluid from the lower portion port of the vertically-oriented serpentine convection coil to at least one fluid cooling block,
wherein a resulting higher-temperature channelized fluid output from the at least one fluid cooling block is forwarded to the external cooling module for thermal conditioning into the lower-temperature channelized fluid.

15. The hybrid liquid cooling system of claim 1, wherein the at least one fluid cooling block comprises a first fluid cooling block and a second fluid cooling block that are fluidly-coupled in series with each other.

* * * * *